United States Patent
Liu et al.

(10) Patent No.: US 7,917,037 B2
(45) Date of Patent: Mar. 29, 2011

(54) INTERNAL EMI SHIELD FOR AN OPTOELECTRONIC MODULE

(75) Inventors: Linda Liu, San Jose, CA (US); Tom Downey, Cupertino, CA (US); John Christian Moller, Castro Valley, CA (US); Chris Togami, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 627 days.

(21) Appl. No.: 11/029,944

(22) Filed: Jan. 5, 2005

(65) Prior Publication Data

US 2005/0152701 A1   Jul. 14, 2005

Related U.S. Application Data

(60) Provisional application No. 60/534,229, filed on Jan. 5, 2004.

(51) Int. Cl.
*H04B 10/00* (2006.01)
*H04B 10/12* (2006.01)

(52) U.S. Cl. .......................... 398/138; 398/135; 398/139

(58) Field of Classification Search .................. 398/128, 398/130, 135, 138, 139, 164; 361/816, 818; 385/92
See application file for complete search history.

(56) References Cited

U.S. PATENT DOCUMENTS

| | | | | |
|---|---|---|---|---|
| 4,162,093 A * | 7/1979 | Sigmund | ........................ | 285/47 |
| 5,060,114 A * | 10/1991 | Feinberg et al. | ............... | 361/706 |
| 5,326,414 A * | 7/1994 | Mosher et al. | ................ | 156/242 |
| 5,978,221 A * | 11/1999 | Sawa et al. | ..................... | 361/704 |
| 6,431,765 B1 * | 8/2002 | Chen et al. | ...................... | 385/92 |
| 6,819,568 B2 * | 11/2004 | Cao | ............................... | 361/728 |
| 6,856,769 B1 * | 2/2005 | Steffensen et al. | ........... | 398/135 |
| 7,135,643 B2 * | 11/2006 | van Haaster et al. | ......... | 174/382 |
| 2004/0105633 A1 * | 6/2004 | Ishikawa et al. | ................ | 385/92 |
| 2006/0099403 A1 * | 5/2006 | Johnson | ......................... | 428/323 |

OTHER PUBLICATIONS

ECCOSORB(R) MCS/SS6M Eliminates Cavity Resonance in Optical Transmitter/Receiver for Large Telecom Company, Jan. 6, 2003, Emerson & Cuming website.*
"Absorber Principles", Dec. 8, 2003, Emerson and Cuming, www.eccosorb.com.*
Emerson & Cumming Microwave Products, ECCOSORB®FDS Broad Frequency High-Loss Silicon Rubber Sheet, Nov. 12, 2002 http://www.eccosorb.com/catalog/eccosorb/FDS.pdf.
Emerson & Cumming Microwave Products, ECCOSORB®MCS Thin, Flexible, Broadband Absorbers, Nov. 12, 2002 http://www.eccosorb.com/catalog/eccosorb/MCS.pdf.

* cited by examiner

*Primary Examiner* — Ken N Vanderpuye
*Assistant Examiner* — Daniel G Dobson
(74) *Attorney, Agent, or Firm* — Maschoff Gilmore & Israelsen

(57) ABSTRACT

A shield device for preventing the emission of electromagnetic interference ("EMI") from an optoelectronic device, such as an optical transceiver, is disclosed. In particular, an EMI shield is disclosed for placement within an optical transceiver module in order to intercept and absorb EMI produced by electronic components included within the transceiver. This absorption by the EMI shield prevents EMI from escaping the optical transceiver module and interfering with other electronic components that are typically placed in close proximity to the transceiver. The EMI shield in one embodiment includes a sheet of EMI absorbing material that is sized for placement within the transceiver. The EMI shield can be interposed between an outer shell of the transceiver and electronic components located on a printed circuit board that is disposed within the transceiver. The proximity of the EMI shield to the EMI-producing electronic components maximizes EMI absorption by the shield.

19 Claims, 5 Drawing Sheets

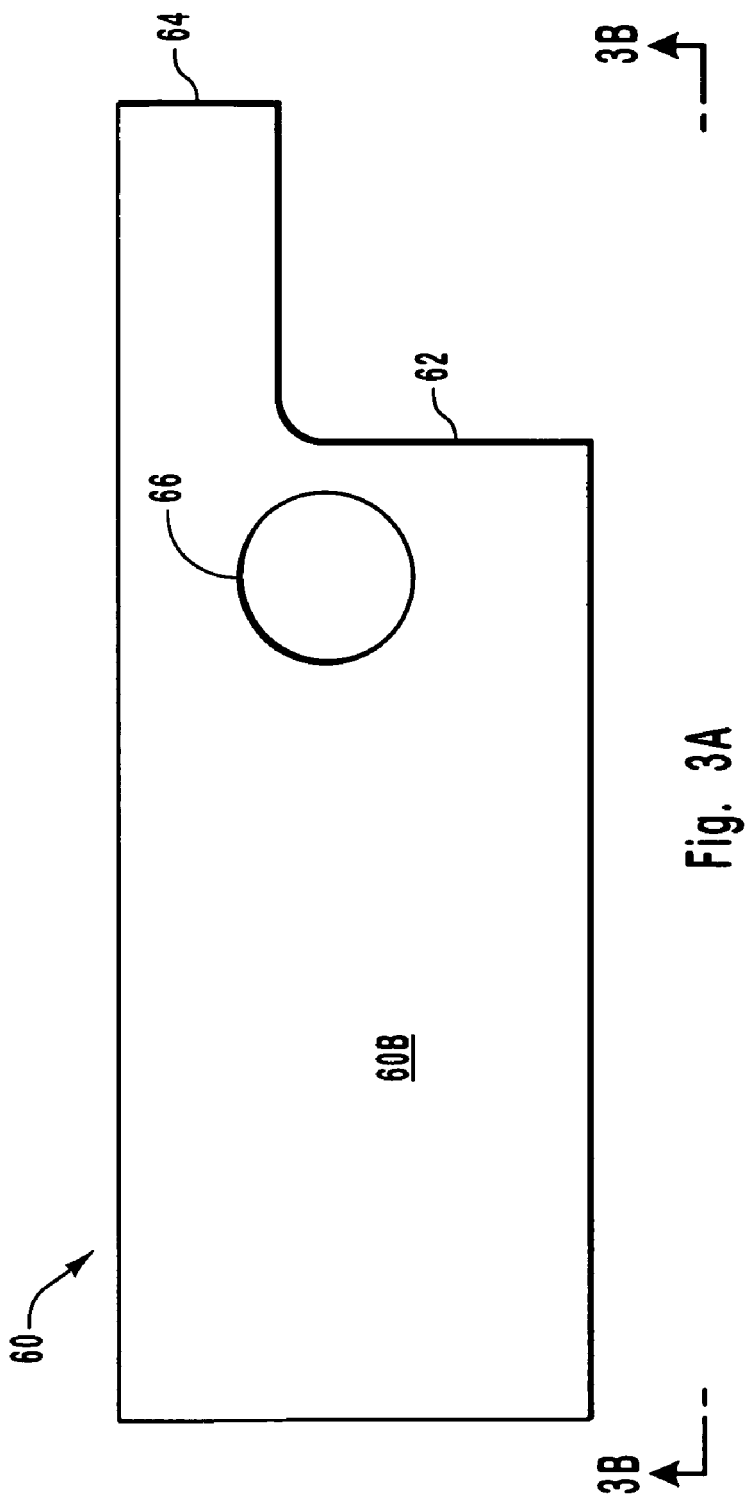
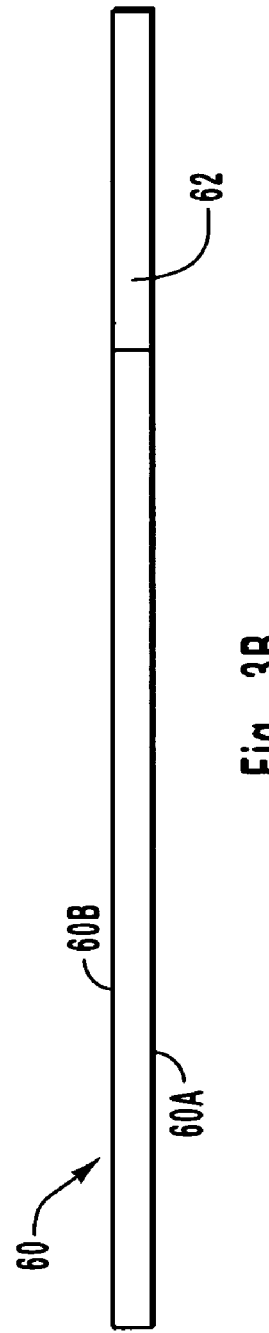
Fig. 3A
Fig. 3B

INTERNAL EMI SHIELD FOR AN OPTOELECTRONIC MODULE

CROSS-REFERENCE TO RELATED APPLICATIONS

This application claims the benefit of U.S. Provisional Application No. 60/534,229, entitled "INTERNAL EMI SHIELD FOR AN OPTOELECTRONIC MODULE," filed Jan. 5, 2004, which is incorporated herein by reference in its entirety.

BACKGROUND OF THE INVENTION

1. The Field of the Invention

The present invention generally relates to optical transceiver modules and other optoelectronic devices. More particularly, the present invention relates to an internal shield for use in reducing electromagnetic interference emitted by such modules and devices by attenuating electromagnetic fields produced by components located therein.

2. The Related Technology

Fiber optics are increasingly used for transmitting voice and data signals. As a transmission medium, light provides a number of advantages over traditional electrical communication techniques. For example, light signals allow for extremely high transmission rates and very high bandwidth capabilities. Also, light signals are resistant to electro-magnetic interferences that would otherwise interfere with electrical signals. Light also provides a more secure signal because it doesn't allow portions of the signal to escape from the fiber optic cable as can occur with electrical signals in wire-based systems. Light also can be conducted over greater distances without the signal loss typically associated with electrical signals on copper wire.

While optical communications provide a number of advantages, the use of light as a transmission medium presents a number of implementation challenges. In particular, the data carried by a light signal must be converted to an electrical format when received by a device, such as a network switch. Conversely, when data is transmitted to the optical network, it must be converted from an electronic signal to a light signal. A number of protocols define the conversion of electrical signals to optical signals and transmission of those optical, including the ANSI Fibre Channel (FC) protocol. The FC protocol is typically implemented using a transceiver module at both ends of a fiber optic cable. Each transceiver module typically contains a laser transmitter circuit capable of converting electrical signals to optical signals, and an optical receiver capable of converting received optical signals back into electrical signals.

Typically, a transceiver module is electrically interfaced with a host device—such as a host computer, switching hub, network router, switch box, computer I/O and the like—via a compatible connection port. Moreover, in some applications it is desirable to miniaturize the physical size of the transceiver module to increase the port density, and therefore accommodate a higher number of network connections within a given physical space. In addition, in many applications, it is desirable for the module to be hot-pluggable, which permits the module to be inserted and removed from the host system without removing electrical power.

To accomplish many of these objectives, international and industry standards have been adopted that define the physical size and shape of optical transceiver modules to insure compatibility between different manufacturers. For example, in 2000, a group of optical manufacturers developed a set of standards for optical transceiver modules called the Small Form-factor Pluggable ("SFP") Transceiver Multi-Source Agreement ("MSA"), incorporated herein by reference. In addition to the details of the electrical interface, this standard defines the physical size and shape for the SFP transceiver modules, and the corresponding host port, so as to insure interoperability between different manufacturers' products. There have been several subsequent standards, and proposals for new standards, including the XFP MSA for 10 Gigabit per second modules using a serial electrical interface, that also define the form factors and connection standards for pluggable optoelectronic modules, such as the published draft version 0.92 (XFP MSA), incorporated herein by reference.

As optical transmission speed provided by optoelectronic modules increases, additional problems arise. For example, electronic devices and components operating at high frequencies typically produce and emit electromagnetic fields that cause electromagnetic interference. This electromagnetic interference, referred to as _"EMI,"_ is undesired electrical noise resulting from the electromagnetic fields. The phenomenon is undesirable because EMI can interfere with the proper operation of other electrical components. Optical transceiver packages, especially those operating at high transmission speeds, typically include several such electronic devices and components and are therefore especially susceptible to emitting EMI. In particular, the physical configuration of existing transceiver modules does a poor job of containing EMI—especially as the generating speed of the module increases.

One attempt to limit EMI emissions from optoelectronic modules, such as optical transceiver modules, involves the use of EMI cages. EMI cages can be sized to fit about the exterior portion of the transceiver module and configured to intercept EMI that is emitted from electronic components contained within the transceiver module. Such cages, while effective at reducing EMI, are nonetheless accompanied by certain disadvantages. Among these is the additional design complexity of the transceiver operating environment that results from the use of such cages, as well as the additional space required for the cages in the operating environment. Additionally, the cage is adjacent the exterior of the transceiver module, which places it further away from the EMI sources that are located within the transceiver module. As EMI commonly follows a diverging path as it radiates away from its source, this requires relatively more cage material to be used to prevent EMI emission than if the EMI were attenuated closer to the EMI source.

In light of the above, therefore, a need exists in the art for a means by which EMI can be effectively reduced in optoelectronic modules, such as optical transceiver modules. Such means should be easily implemented while avoiding design complications of the transceiver operating environment. Further, any solution should avoid the use of excessive amounts of shielding material. In addition, it would be helpful to implement the solution in a manner that meets existing transceiver form factors.

BRIEF SUMMARY

Briefly summarized, embodiments of the present invention are directed to a shield device for preventing the emission of electromagnetic interference ("EMI") from an optoelectronic device, including optical transceiver modules that are employed in the transmission of data via optical signals. In particular, an EMI shield is disclosed herein for placement within an optical transceiver module in order to intercept and absorb EMI produced by electronic components included within the transceiver. This absorption by the EMI shield prevents EMI from escaping the optical transceiver module and interfering with other electronic components that are typically placed in close proximity to the transceiver. Additionally, the EMI shield can prevent interference between electronic components located within the optical transceiver module itself.

In one embodiment, therefore, an optical transceiver module having an EMI shield is disclosed, comprising a housing, a component contained within the housing that produces an electromagnetic field, and a compliant shield composed of a material that attenuates electromagnetic fields, wherein the compliant shield is positioned within the housing such that it attenuates the electromagnetic field produced by the component.

In another embodiment, an optical transceiver module having an EMI shield is disclosed, comprising a transceiver body, a shell that slidably engages the transceiver body to define a housing, a printed circuit board mounted to the transceiver body and contained within the housing, the printed circuit board including an electronic component that produces an electromagnetic field, and a shield that is press fit within the housing between the shell and the electronic component, wherein the shield is configured to attenuate the electromagnetic field of the electronic component.

In yet another embodiment, a shielding system for controlling the emission of electromagnetic interference from an optical transceiver module that includes a printed circuit board and an electronic component attached to the printed circuit board is disclosed, comprising a first sheet composed of an electromagnetic field-attenuating material, the first sheet having a generally rectangular shape, and the first sheet being positioned within the optical transceiver module to attenuate electromagnetic fields emitted from the electronic component of the printed circuit board.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of embodiments of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 3A is a top view of an internal EMI shield configured in accordance with another embodiment;

FIG. 3B is a side view of the internal EMI shield of FIG. 3A, taken along the line 3B-3B;

DETAILED DESCRIPTION OF EXEMPLARY EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-5 depict various features of embodiments of the present invention, which is generally directed to a shield apparatus for internal use within an optical transceiver module or other optoelectronic device. The internal shield is configured for placement within the transceiver module to absorb and attenuate electromagnetic radiation that causes electromagnetic interference ("EMI") that is produced by various electronic components that are also located within the transceiver. Absorption and/or attenuation of electromagnetic radiation by the internal shield correspondingly and desirably reduces the emission of EMI from the transceiver module.

Figure 1:
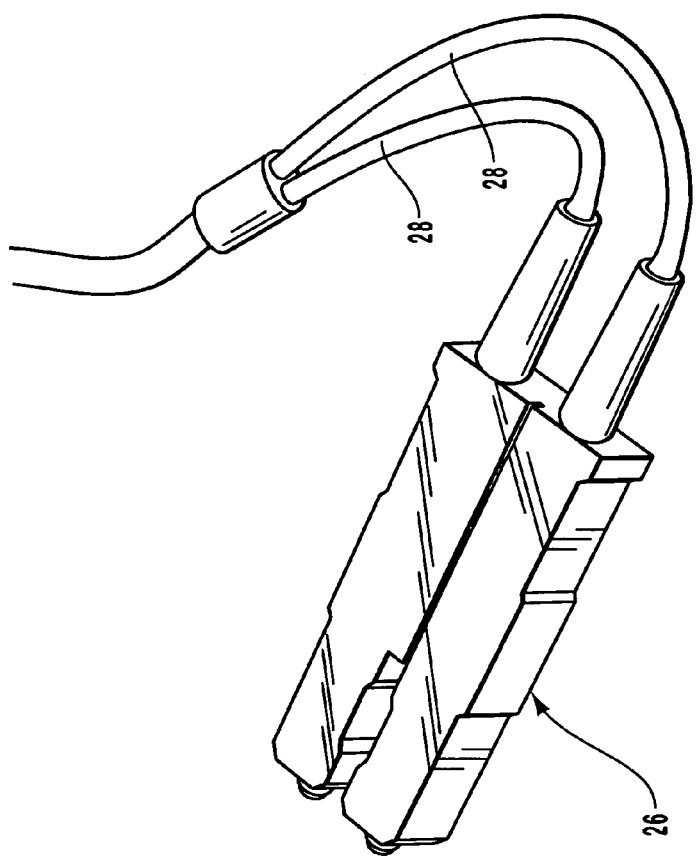
FIG. 1 is a perspective view of an optical transceiver module that incorporates features of the internal electromagnetic interference ("EMI") shield disclosed herein according to one embodiment of the present invention.
Figure 1:
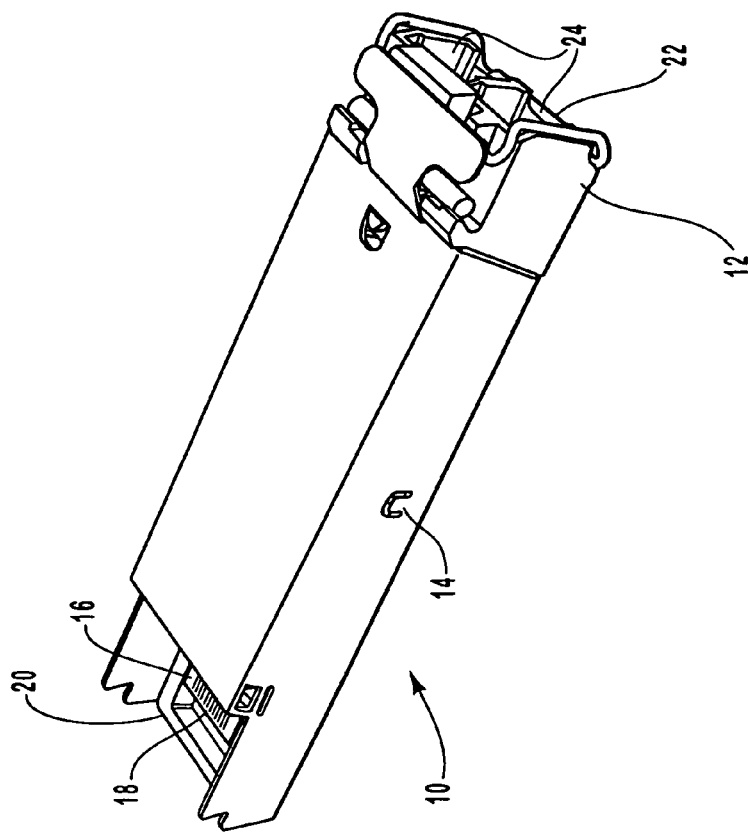

Reference is first made to FIG. 1, which shows one exemplary environment in which embodiments of the present invention can be practiced. In detail, FIG. 1 includes an optical transceiver module ("transceiver"), generally designated at 10, which contains one embodiment of the internal shield (not shown here) for reducing the emission of EMI. The transceiver 10 includes a body 12 and a shell 14 that cooperate to form an outer covering for interior elements of the transceiver. One interior element of the transceiver 10 is a transceiver printed circuit board ("TPCB") 16. The TPCB 16 includes a card-edge connector 18 defined on an edge thereof that extends from a first open end 20 of the transceiver 10 for electrically interfacing with a connector receptacle of a host device (not shown).

A second open end 22 of the transceiver 10 includes dual optical ports 24 that selectively receive a duplex optical connector 26 that is in turn connected with a pair of optical fibers 28.

The transceiver 10 shown in FIG. 1 conforms in one embodiment to the small-form pluggable ("SFP") form factor discussed above. However, it should be appreciated that embodiments of the present invention can be practiced in connection with transceivers conforming to other form factors and configurations as well. Indeed, not only transceivers, but other non-transceiver optoelectronic devices can include the shield device to be described herein. Accordingly, a variety of optoelectronic devices and components that have a need for controlling the emission of EMI can benefit from the principles described herein. The following discussion, therefore, should be viewed as exemplary of embodiments of the present invention, and not restrictive.

Figure 2A:
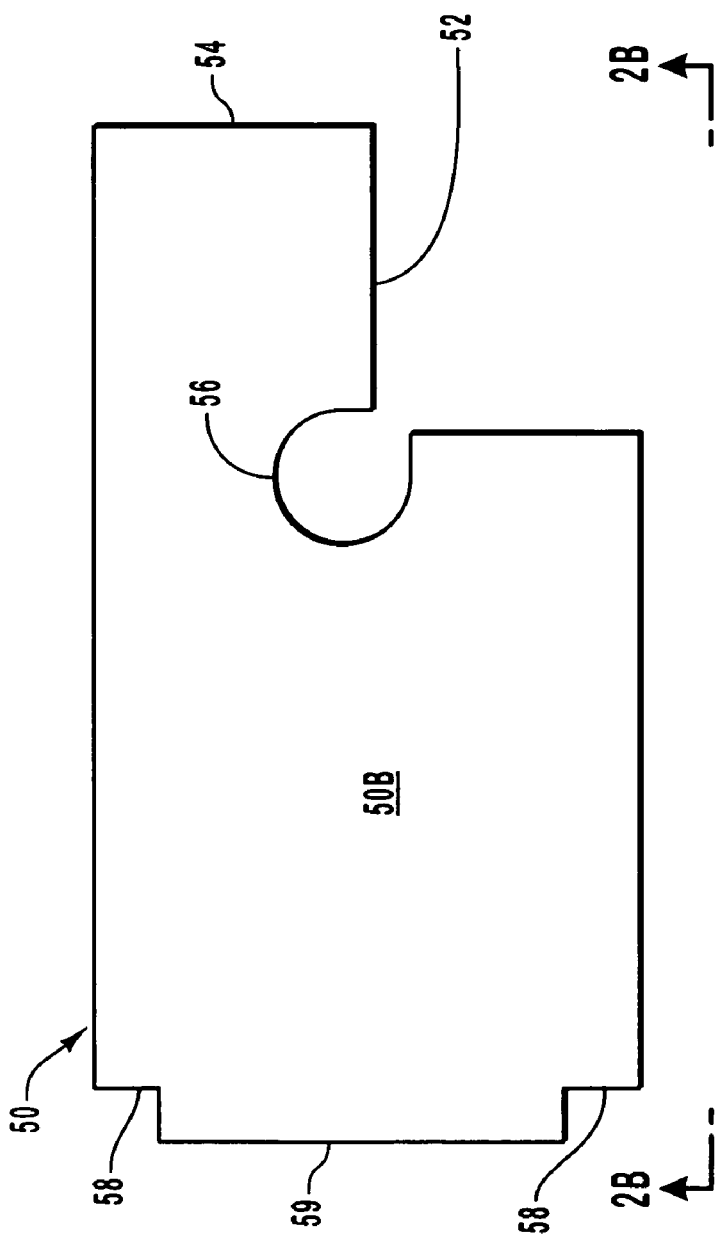
FIG. 2A is a top view of an internal EMI shield configured in accordance with one embodiment.
Figure 2B:
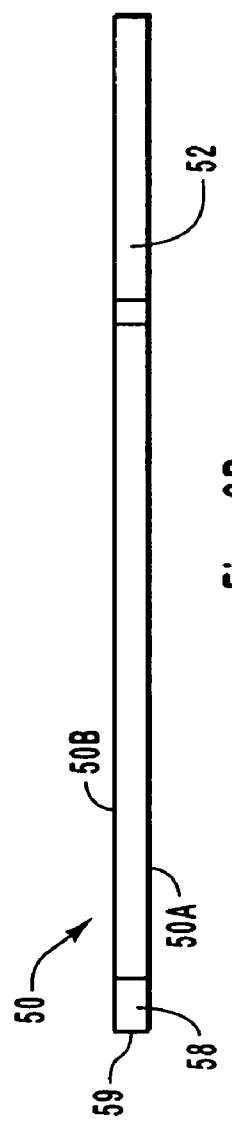
FIG. 2B is a side view of the internal EMI shield of FIG. 2A, taken along the line 2B-2B.

Reference is now made to FIGS. 2A and 2B together in describing various details of one exemplary embodiment of the present invention. In particular, an internal EMI shield, generally designated at 50, is shown. The EMI shield 50 is configured and shaped to fit within an optical transceiver module, such as the transceiver 10 shown in FIG. 1. As such, the present embodiment of the EMI shield 50 forms a sheet that is generally rectangular shaped and includes a corner notch 52 at a first end 54 thereof. The corner notch 52 communicates with a hole 56 defined in the EMI shield 50. In addition, two corner notches 58 are included on a second end 59 of the EMI shield 50. Note that the shape and features of the EMI shield can be modified to suit other applications, transceiver designs, placement locations, etc. As such, the particular shape and cutout configurations can be changed from what is shown in the accompanying figures.

As best seen in FIG. 2B, the EMI shield is relatively thin with respect to its length and width. The overall dimensions, however, can be modified to suit a particular application. Generally, the EMI shield thickness is sufficient to absorb or attenuate EMI that is emitted from transceiver components, while the length and width thereof are chosen to adequately cover such emitting components, as will be seen in more detail below. In the embodiment illustrated in FIGS. 2A and 2B, the thickness of the EMI shield is approximately 0.030 inch (0.076 centimeter), the overall length is approximately 0.891 in (2.26 cm), and the overall width is approximately 0.47 in (1.19 cm), while the hole 56 has a radius of approximately 0.060 in (0.15 cm).

The EMI shield 50 is composed of a material that effectively prevents the passage of EMI through the shield. In one embodiment, the EMI shield 50 is composed of a non-conductive polymer, such as silicone, though other electromagnetic field-attenuating materials can also be employed. In one embodiment, an electrically non-conductive silicone rubber product, sold by Emerson & Cuming Company under the trademark ECCOSORB® MCS, is used as the material from which the EMI shield 50 is formed. This product lends flexibility to the EMI shield 50, which can more easily facilitate positioning of the EMI shield within the transceiver or other optoelectronic device.

In one embodiment, the EMI shield 50 can be die-cut so as to facilitate rapid manufacturing thereof. Also, some surface featuring can be included on the surfaces 50A and 50B of the EMI shield to enable sufficient engagement of the EMI shield with portions of the transceiver interior on which the EMI shield is positioned. In one embodiment, an assembly tool can be used to assist the positioning of the EMI shield within the transceiver. Preferably, the EMI shield is positioned carefully within the transceiver during assembly to avoid improper placement that can damage sensitive transceiver components, such as flex circuits that are described below.

Collective reference is now made to FIGS. 3A and 3B, which together depict another embodiment of the EMI shield. In general, the EMI shield of the present embodiment shares many characteristics that are similar to that described in connection with the EMI shield 50 of FIGS. 2A and 2B. As such, only selected aspects of the EMI shield of the present embodiment are discussed here. In particular, an EMI shield, generally designated at 60, is shown. The EMI shield 60 comprises a sheet having a generally rectangular shape and including planar first and second surfaces 60A and 60B. The EMI shield 60 includes a corner notch 62 defined on a first end 64 thereof. A hole 66 is also defined in the EMI shield 60, though it does not communicate with the corner notch 62. Upon comparative inspection of the EMI shield 60 with the EMI shield 50, it is appreciated that the, EMI shield can have one of a variety of physical configurations according to need. As will be seen further below, the differing shapes of the EMI shields disclosed herein are beneficial in accommodating their use within different areas of the transceiver.

The composition of the EMI shield 60 is similar to that described above in connection with the EMI shield 50. As such, in one embodiment the EMI shield is composed of a non-conductive polymer, such as silicone. Again, it is appreciated that other shapes, configurations, and compositions of the EMI shield are also possible, in accordance with the goal of the EMI shield in reducing EMI.

Figure 4:
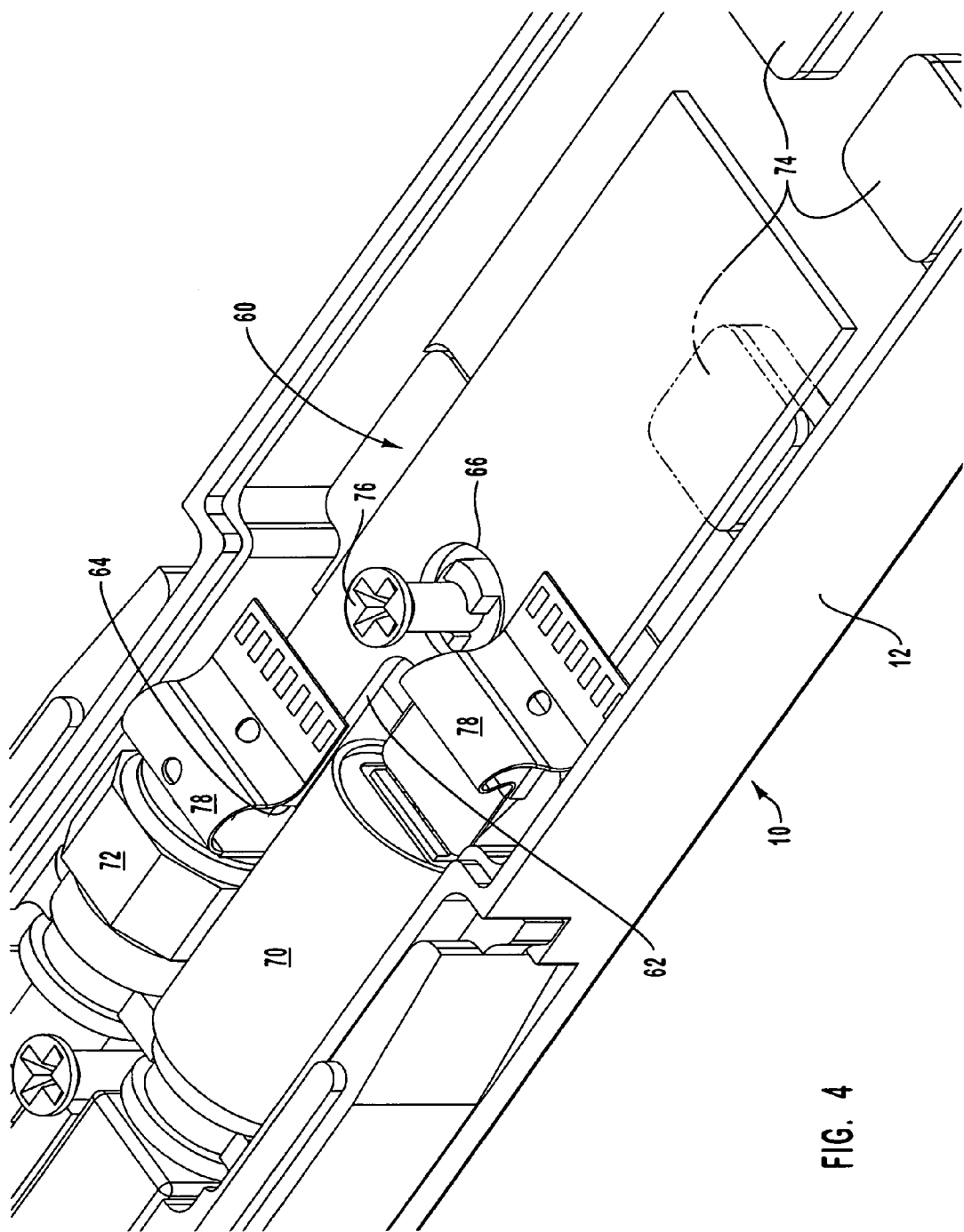
FIG. 4 is a perspective view of a portion of an optical transceiver module, showing the placement of the internal EMI shield of FIGS. 3A and 3B within the module.

Reference is now made to FIG. 4. As mentioned, the EMI shield is used in embodiments of the present invention to prevent the escape of EMI from an optical transceiver module or other device. This is illustrated in FIG. 4, which shows the body 12 of the transceiver 10 from FIG. 1 with the shell 14 removed, thereby affording a view of some of the interior transceiver elements located within the body. In detail, a transmitter optical sub-assembly ("TOSA") 70 and receiver optical sub-assembly ("ROSA") 72 are shown positioned in the transceiver body 12 and are configured to respectively transmit and receive optical signals for the transceiver 10. The TOSA 70 and ROSA 72 are optically coupled to the dual optical ports 24, seen in FIG. 1, to enable the passage of optical signals between the optical fibers 28 and the TOSA or ROSA via the duplex connector 26. In addition to the TOSA 70 and ROSA 72, the transceiver 10 can include various electronic components in the transceiver body 12. Some of these are shown at 74 in FIG. 4.

The EMI shield 60 is shown in FIG. 4 positioned within the body 12 of the transceiver 10, according to one embodiment. As illustrated, the EMI shield 60 is positioned to lie flat in the cavity defined by the transceiver body 12 such that selected electronic components 74 are covered thereby. A screw 76 or other fastening means for securing the TPCB (FIG. 5) to the transceiver body 12 is passed through the hole 66 of the EMI shield 60. Though not used as such here, in one embodiment the screw 76 can also be employed in securing the EMI shield in a specified position within the transceiver body 12. Alternatively, the EMI shield can be secured within the transceiver 10 via other means, such as adhesives. In addition to absorbing electromagnetic fields from the electronic components 74, shown in FIG. 4, the EMI shield 60 can also serve in the position shown here to absorb electromagnetic fields from other portions of the transceiver 10, such as components mounted on an adjacent surface of the TPCB 16, as will be described below.

Figure 5:
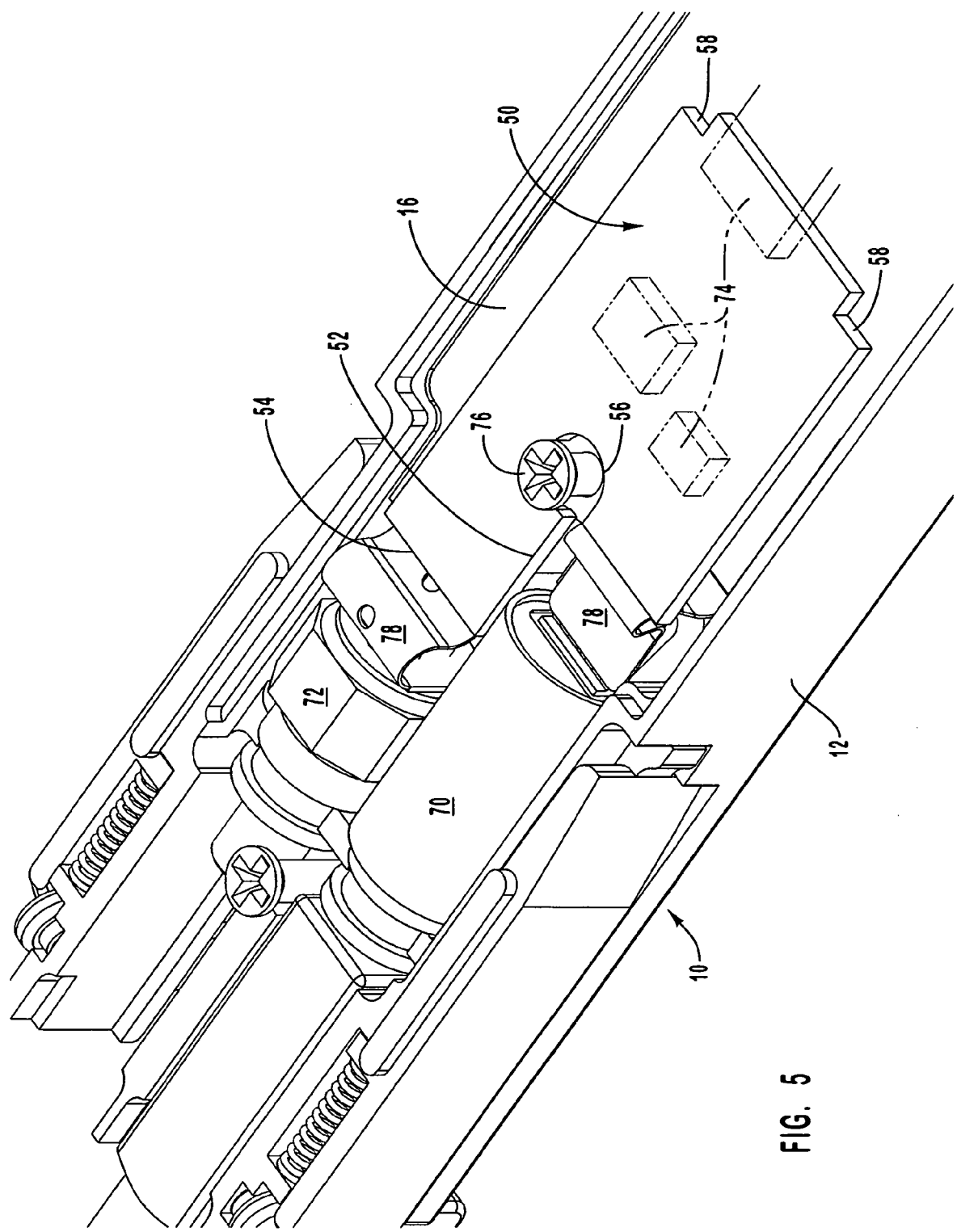
FIG. 5 is a perspective view of an optical transceiver module, showing the placement of the internal EMI shield of FIGS. 2A and 2B above a printed circuit board that is positioned within the module.

Reference is now made to FIG. 5, which shows the transceiver 10, with the TPCB 16 positioned therein and secured within the body 12 by the screw 76. In this position, the TPCB 16 overlays the EMI shield 60 (see FIG. 4) within the transceiver body 12. The TPCB 16 is shown attached to flex circuits 78 that respectively extend from the TOSA 70 and ROSA 72. Also, various electronic components 74 are included on both the upper and lower surfaces of the TPCB 16.

The EMI shield 50 is positioned atop the TPCB 16 in this view as to cover specified electronic components. As can be seen, the EMI shield 50 is positioned such that the hole 56 receives the screw 76 and the corner notch 52 fits about the flex circuit 78 extending from the TOSA 70. Though not explicitly shown, the corner notches 58 also fit about corresponding structures of the transceiver body 12.

As mentioned, in one embodiment both the EMI shield 50 and the EMI shield 60 can be positioned to form a shielding system to prevent EMI emission from the TPCB 16. This can be performed by positioning the EMI shield 60 as shown in FIG. 4 within the transceiver 10 is a press fit arrangement as explained below. The EMI shield 50 can then be positioned adjacent the upper surface of the TPCB 16 and secured in a similar press fit arrangement. This forms a "sandwich" configuration, wherein the TPCB 16 is sandwiched on either surface between the EMI shields 50 and 60. So configured, electromagnetic fields that are produced by the electronic components 74 located on either surface of the TPCB 16, which components are covered by the EMI shields 50 and 60, are absorbed and/or attenuated by the shields. This in turn prevents the emission from the transceiver 10 of disruptive EMI. Alternatively, the EMI shields 50 and 60 can be employed separately in a transceiver or other optoelectronic module. Also, EMI from transceiver components not located on the TPCB can also be attenuated by placement of the EMI shields as described above.

In the above embodiment, the EMI shields are in physical contact with the optoelectronic components that emit electromagnetic radiation during transceiver operation in order to maximize electromagnetic attenuation in order to reduce any EMI leakage paths from the transceiver. In other embodiments, however, the EMI shield can be placed at any distance from the EMI-producing component, if desired.

In another embodiment, at least one surface of the EMI shield is smooth and slick. As previously stated, the absorption or attenuation of electromagnetic radiation increases when the shield is in contact with the components that emit the electromagnetic radiation. During manufacture of the transceiver according to one embodiment, the housing of the transceiver is formed by sliding a shell onto the body, and as such, the body and the shell are mechanically configured to permit such sliding engagement. With reference to FIG. 1, for example, the shell 14 may be configured to slide onto the body 12. With reference to FIGS. 1 and 5, the first surface 50A of the EMI shield 50 is smooth and permits the shell to be slid onto the body without displacing the EMI shield. As the shell slides onto the body, the shell can press the shield against the components that emit most of the electromagnetic radiation. At the same time, the smooth surface of the shield that is against the shell enables the shell to continue sliding to a final position without displacing the shield with respect to the electrical and/or optical components of the transceiver. In this example, this eliminates the need for mechanical fasteners or adhesives to secure the shield 50 against the electronic components and also simplifies manufacture of the transceiver. In one embodiment, the EMI shield is manufactured with a compliant material, which allows the shield to be compressed between the transceiver shell and the TPCB components, further assisting proper EMI shield placement.

As mentioned, in one embodiment the top, or first, surface 50A of the EMI shield can be relatively smooth or slick to permit the transceiver shell to be slid onto the transceiver body without displacing the shield. The bottom, or second, surface 50B of the shield can be equally smooth, or in another embodiment can have a surface that is relatively less smooth and that generates relatively more friction against the components to further prevent the shield from being displaced during assembly of the transceiver. In this configuration, no adhesive on either surface would be required. These principles can also extend to placement of the EMI shield 60 as described above.

In accordance with the above discussion, the EMI shield in one embodiment can be positioned within the transceiver using friction and/or compressive engagement, and without mechanical fastener-assisted or adhesive fixation to the shell, body, TPCB, or TPCB component. As mentioned, this advantageously speeds manufacture of the transceiver. In other embodiments, however, other schemes can be employed to secure the EMI shield within the transceiver including mechanical fasteners, such as a screw, and adhesives. In the latter case, the adhesive can be employed to secure a surface of the EMI shield to the TPCB or an interior surface of the transceiver. In one embodiment, an adhesive can be applied between the EMI shield surface and a portion of one or more electronic components located on the TPCB, for example. However, caution should be exercised in this case to ensure that shear forces are not introduced on the electronic components sufficient to dislodge them from the TPCB or other mounting surface when the transceiver is assembled by sliding, as described above.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical transceiver module, comprising:
   a housing having body and a shell;
   at least one component contained within the housing that produces an electromagnetic field;
   a first electrically non-conductive compliant shield composed of a material that attenuates electromagnetic fields, the first compliant shield arranged between the at least one component and a top side of the shell such that the first compliant shield is pressed against the at least one component by the shell without being fixed to the shell or the at least one component, wherein the first compliant shield attenuates the electromagnetic field produced by the at least one component; and
   a second electrically non-conductive compliant shield composed of a material that attenuates electromagnetic fields, the second compliant shield arranged between the at least one component and a bottom side of the shell so as to form a sandwich configuration without being fixed to the shell or the at least one component such that the at least one component is surrounded on at least two sides by the first and second electrically non-conductive compliant shields.

2. The optical transceiver module as defined in claim 1, wherein the compliant shield is composed of a flexible polymer.

3. The optical transceiver module as defined in claim 1, further comprising a printed circuit board located within the housing.

4. The optical transceiver module as defined in claim 3, wherein the at least one component is an electronic component, and wherein the electronic component is located on the printed circuit board.

5. The optical transceiver module as defined in claim 4, wherein the compliant shield is positioned adjacent the printed circuit board so as to be in physical contact with the at least one electronic component.

6. The optical transceiver module as defined in claim 4, further comprising a second compliant shield positioned adjacent a portion of the printed circuit board.

7. The optical transceiver module as defined in claim 1, wherein the compliant shield is in a press fit engagement with the at least one component and a portion of the optical transceiver module.

8. The optical transceiver module as defined in claim 1, wherein an adhesive is used to secure the position of the compliant shield within the housing.

9. An optical transceiver module, comprising:
   a transceiver body;
   a shell that slidably engages the transceiver body to define a housing;
   a printed circuit board mounted to the transceiver body and contained within the housing, the printed circuit board including electronic components that produce an electromagnetic field and a hole disposed substantially in the center of the printed circuit board; and a shield that is press fit within the housing between the shell and the electronic components, wherein the press fit is formed as the shell slidably engages the transceiver body and the shield has a surface configured to allow the shell to slidably engage the transceiver body without displacing the shield while the press fit is formed, wherein the shield is shaped similarly to the printed circuit board, has a hole disposed substantially in the center of a width of the shield such that the hole of the printed circuit board is substantially aligned with the hole of the shield when the shield is disposed over the printed circuit board, and is in contact with at least one of the electronic components and is configured to attenuate the electromagnetic field of the electronic components, wherein the shield includes a smooth top surface that prevents displacement of the shield with respect to the at least one electronic component when the shell slidably engages the transceiver body.

10. The optical transceiver module as defined in claim 9, wherein the shield includes a bottom surface, the bottom surface includes surface features to assist the press fit of the shield with the at electronic components.

11. The optical transceiver module as defined in claim 9, further comprising a receiver optical subassembly, a transmitter optical subassembly, and a screw for securing the position of the printed circuit board within the housing, wherein the shield includes at least one cutout to accommodate the placement of at least one of the receiver optical subassembly, the transmitter optical subassembly, and the screw.

12. The optical transceiver module as defined in claim 9, wherein the shield is composed of an electrically non-conductive silicone rubber product, sold under the trademark ECCOSORB.RTM.MCS.

13. The optical transceiver module as defined in claim 9, wherein the shield is flexible.

14. A shielding system for controlling the emission of electromagnetic interference from an optical transceiver module, the optical transceiver module including a printed circuit board and at least one electronic component attached to the printed circuit board, the shielding system comprising:
  a first sheet composed of a non-conductive electromagnetic field-attenuating material, the first sheet having a generally rectangular shape with a cutout portion for accommodating a flex connector of the optical transceiver module, the first sheet being positioned within the optical transceiver module above the printed circuit board to attenuate electromagnetic fields emitted from the at least one electronic component of the printed circuit board without being fixed to the optical transceiver module; and
  a second sheet composed of a non-conductive electromagnetic field-attenuating material, the second sheet having a generally rectangular shape and being positioned within the transceiver and below the printed circuit board to attenuate electromagnetic fields emitted form the at least one electronic component of the printed circuit board without being fixed to the optical transceiver module, wherein the first sheet covers a majority of a top surface of the printed circuit board and the second sheet covers a majority of a bottom surface of the printed circuit board so as to attenuate electromagnetic fields emitted from both the top and bottom surface of the PCB.

15. The shielding system as defined in claim 14, wherein the first sheet is positioned adjacent a first surface of the printed circuit board such that the first sheet physically engages the at least one electronic component.

16. The shielding system as defined in claim 15, further comprising a second sheet composed of an electromagnetic field-attenuating material, the second sheet having a generally rectangular shape, the second sheet being positioned adjacent a second surface of the printed circuit board such that the second sheet attenuates electromagnetic fields emitted from at least one additional electronic component attached to the printed circuit board.

17. The shielding system as defined in claim 16, wherein the first and second sheets are positioned adjacent opposite surfaces of the printed circuit board in a sandwich fashion.

18. The shielding system as defined in claim 17, wherein at least one of the first and second sheets includes a cutout portion.

19. The shielding system as defined in claim 18, wherein the first sheet has a thickness of approximately 0.030 inch (0.076 centimeter).

* * * * *